United States Patent
Won et al.

(10) Patent No.: US 7,683,682 B1
(45) Date of Patent: Mar. 23, 2010

(54) FREQUENCY DIVIDER FOR WIRELESS COMMUNICATION SYSTEM AND DRIVING METHOD THEREOF

(75) Inventors: Kwang Ho Won, Gyeonggi-do (KR); Yeon Kug Moon, Seoul (KR); Hyun Chol Shin, Seoul (KR); Seung Soo Kim, Seoul (KR)

(73) Assignee: Korea Electronics Technology Institute (KR)

( * ) Notice: Subject to any disclaimer, the term of this patent is extended or adjusted under 35 U.S.C. 154(b) by 0 days.

(21) Appl. No.: 12/200,405

(22) Filed: Aug. 28, 2008

(51) Int. Cl.
*H03B 19/06* (2006.01)

(52) U.S. Cl. .................. 327/118; 327/115; 327/212; 377/47

(58) Field of Classification Search .............. 327/115, 327/117, 118, 202, 203, 208–212, 218; 377/47, 377/48
See application file for complete search history.

(56) References Cited

U.S. PATENT DOCUMENTS

| | | | |
|---|---|---|---|
| 3,956,880 A * | 5/1976 | O'Connor | ................. 368/87 |
| 6,218,895 B1 | 4/2001 | De et al. | |
| 6,462,595 B1 * | 10/2002 | Hsu et al. | ................. 327/215 |
| 6,765,418 B2 * | 7/2004 | Murata | ................. 327/115 |
| 2004/0239394 A1 * | 12/2004 | Miyazaki et al. | ............ 327/210 |
| 2007/0080754 A1 | 4/2007 | Park et al. | |

* cited by examiner

*Primary Examiner*—Lincoln Donovan
*Assistant Examiner*—William Hernandez
(74) *Attorney, Agent, or Firm*—NSIP Law

(57) ABSTRACT

A frequency divider for a wireless communication system is provided. A frequency divider includes a body bias voltage generator and a divider. The body bias voltage generator generates a body bias voltage including a PMOS body bias voltage and an NMOS body bias voltage whose voltage levels are controlled according to an input signal. The divider includes a plurality of flip-flops whose operation points are determined according to the body bias voltage, and generates an output signal by dividing a frequency of the input signal by N. Each of the flip-flops may include a PMOS logic and an NMOS logic. The PMOS logic may include a plurality of PMOS transistors whose operation points are determined according to the PMOS body bias voltage. The NMOS logic may be connected electrically to the PMOS logic and include a plurality of NMOS transistors whose operation points are determined according to the NMOS body bias voltage.

18 Claims, 6 Drawing Sheets

*Prior Art*

FREQUENCY DIVIDER FOR WIRELESS COMMUNICATION SYSTEM AND DRIVING METHOD THEREOF

TECHNICAL FIELD

The following description relates to a frequency divider for a wireless communication system and a method of driving the same, and more particularly, to a frequency driver for a low-power high-speed operation in a wireless communication system and a method of driving the same.

BACKGROUND

In general, a frequency divider used in a wireless communication system is used in a frequency synthesizer. A frequency synthesizer is used to fix a local oscillation frequency, output from a voltage-controlled oscillator (VCO), at a selected channel frequency. A frequency divider may be designed in a current mode logic (CML) configuration that is high in operation speed and low in power consumption.

FIG. 1 is a circuit diagram of a conventional frequency divider designed in a CML configuration.

Referring to FIG. 1, a CML-based frequency divider 10 includes four stages 30, 31, 32 and 33. The first and third stages 30 and 32 are differential amplifiers that use a gate voltage as an input signal, and the second and fourth stages 31 and 33 are D-latches that are connected in a master-slave configuration. The operations of the first and fourth stages 30 and 33 and the second and third stages 31 and 32 may be determined according to two clocks CK and CKB with opposite phases, and output voltages OUT and OUTB are output accordingly.

According to the above configuration, the swings of the output voltages OUT and OUTB are determined by a bias current Ib and a load resistance RL. Since the output voltages OUT and OUTB are designed to have a very small value in comparison with a power supply voltage VDD, and a transistor performs a switching operation at high speed, this configuration may be advantageous in a high-speed operation. Also, the configuration may maintain the operation speed and the power consumption at the optimal values by controlling the bias current Ib.

Where a conventional CML-based frequency divider is fabricated through a deep submicron CMOS process with a gate length of 130 nm or less, MOS transistors may be stacked in a three-layer configuration.

However, since a power supply voltage may be lowered to about 1 V in a deep submicron process with a gate length of 130 nm or less, it is difficult to supply a sufficient power supply voltage for biasing all of MOS transistors of three-layer configuration in a saturation region. Thus, this design may be unsuitable for aa frequency divider that operates at high speed at a low voltage.

SUMMARY

Accordingly, according to an aspect, there is provided a frequency divider capable of operating at high speed even at a low voltage and a method of driving the same.

According to another aspect, there is provided a frequency divider for a wireless communication system comprising a body bias voltage generator generating a body bias voltage including a PMOS body bias voltage and an NMOS body bias voltage whose voltage levels are controlled according to an input signal, and a divider including a plurality of flip-flops whose operation points are determined according to the body bias voltage, and generating an output signal by dividing a frequency of the input signal by N, wherein each of the flip-flops comprises a PMOS logic including a plurality of PMOS transistors whose operation points are determined according to the PMOS body bias voltage, and an NMOS logic being connected electrically to the PMOS logic and including a plurality of NMOS transistors whose operation points are determined according to the NMOS body bias voltage.

Each of the flip-flops may be a TSPC type.

The body bias voltage generator may control the voltage level of the PMOS body bias voltage and the voltage level of the NMOS body bias voltage on the basis of the frequency or amplitude of the input signal.

The body bias voltage generator may comprise an input signal detector for comparing the input frequency of the input signal with a reference frequency of a predetermined reference signal and generating a comparison signal corresponding to the frequency difference, a PMOS body bias voltage generator for generating the voltage level of the PMOS body bias voltage on the basis of the comparison signal, and an NMOS body bias voltage generator for generating the voltage level of the NMOS body bias voltage on the basis of the comparison signal.

The input signal detector may comprise a frequency detector or a phase detector.

The body bias voltage generator may comprise an input signal detector for comparing the amplitude of the input signal with the amplitude of a predetermined reference signal and generating a comparison signal corresponding to the amplitude difference, a PMOS body bias voltage generator for generating the voltage level of the PMOS body bias voltage on the basis of the comparison signal, and an NMOS body bias voltage generator for generating the voltage level of the NMOS body bias voltage on the basis of the comparison signal.

The input signal detector may comprise an operational amplifier for generating the comparison signal by comparing the amplitude of the input signal with the amplitude of the predetermined reference signal.

The PMOS body bias voltage generator and the NMOS body bias voltage generator may comprise a charge pump for changing the voltage level of the PMOS body bias voltage and the voltage level of the NMOS body bias voltage by increasing or decreasing the number of charges generated on the basis of the comparison signal output from the input signal detector.

The operation point may be a threshold voltage value or a transconductance value.

The body bias voltage generator may generate the body bias voltage that is proportional to the frequency of the input signal.

According to still another aspect, there is provided a frequency divider for a wireless communication system comprising an input signal detector for receiving an input signal, comparing an input frequency of the input signal with a reference frequency of a predetermined reference signal, and generating a comparison signal corresponding to the frequency difference, a PMOS body bias voltage generator for generating a PMOS body bias voltage corresponding to the comparison signal, an NMOS body bias voltage generator for generating an NMOS body bias voltage corresponding to the comparison signal, and a divider including a plurality of flip-flops whose operation points are controlled according to the PMOS and NMOS body bias voltages, and generating an output signal by dividing a frequency of the input signal by N according to the controlled operation points, wherein each of the flip-flops includes: a PMOS logic whose operation point is determined according to the PMOS body bias voltage, and an NMOS logic whose operation point is determined according to the NMOS body bias voltage.

Each of the PMOS and NMOS body bias voltages may be proportional to the input frequency.

Each of the flip-flops may be a TSPC type.

The operation point may be a threshold voltage value or a transconductance value of an MOS transistor included in each of the PMOS and NMOS logics.

According to yet another aspect, there is provided a method of driving a frequency divider that generates an output signal by dividing an input signal by N by using a flip-flop including a plurality of PMOS transistors and a plurality of NMOS transistors, the method comprising generating a body bias voltage including a PMOS body bias voltage and an NMOS body bias voltage, controlling an operation point of the flip-flop by applying the PMOS body bias voltage to each of the PMOS transistors and applying the NMOS body bias voltage to each of the NMOS transistors, and dividing the input signal by N according to the controlled operation point of the flip-flop.

The generating of the body bias voltage may comprise detecting an input frequency of the input signal, comparing the detected input frequency of the input signal with a reference frequency of a predetermined reference signal and generating a comparison signal corresponding to the frequency difference, and controlling the body bias voltage according to the comparison signal.

The voltage level of the body bias voltage may be proportional to the input frequency of the input signal.

The flip-flop may be driven by a TSPC technique.

Other features will become apparent to those skilled in the art from the following detailed description, which, taken in conjunction with the attached drawings, discloses exemplary embodiments of the invention.

BRIEF DESCRIPTION OF THE DRAWINGS

Throughout the drawings and the detailed description, unless otherwise described, the same drawing reference numerals will be understood to refer to the same elements, features, and structures.

DETAILED DESCRIPTION

The following detailed description is provided to assist the reader in gaining a comprehensive understanding of the methods, apparatuses and/or systems described herein. Accordingly, various changes, modifications, and equivalents of the systems, apparatuses and/or methods described herein will be suggested to those of ordinary skill in the art. Also, descriptions of well-known functions and constructions are omitted to increase clarity and conciseness.

A frequency divider according to an exemplary embodiment has a true single-phase clock (TSPC) flip-flop structure that is designed in a current mode logic (CML) configuration. The frequency divider with such a TSPC flip-flop structure may maintain high-speed operation characteristics even at a low operation voltage regardless of the fabrication process.

However, the TSPC flip-flop structure may not control the operation speed and the power consumption. An important design parameter determining the operation speed and the power consumption is a gate width of a MOS transistor constituting the corresponding circuit. Thus, where the gate width is determined in the design stage, the TSPC flip-flop structure may not control the operation speed and the power consumption in the finishing stage. A technology has been recently developed that may control the operation speed and the power consumption by controlling a power supply voltage. However, it may be inefficient to change only a power supply voltage of a specific circuit in a system-on-chip architecture.

Therefore, according to an aspect, there is provided a frequency divider for a wireless communication system which may control the operation speed and the power consumption by using a body bias technique that applies a body bias voltage forwardly or reversely to a MOS transistor constituting a TSPC flip-flop.

Figure 1:
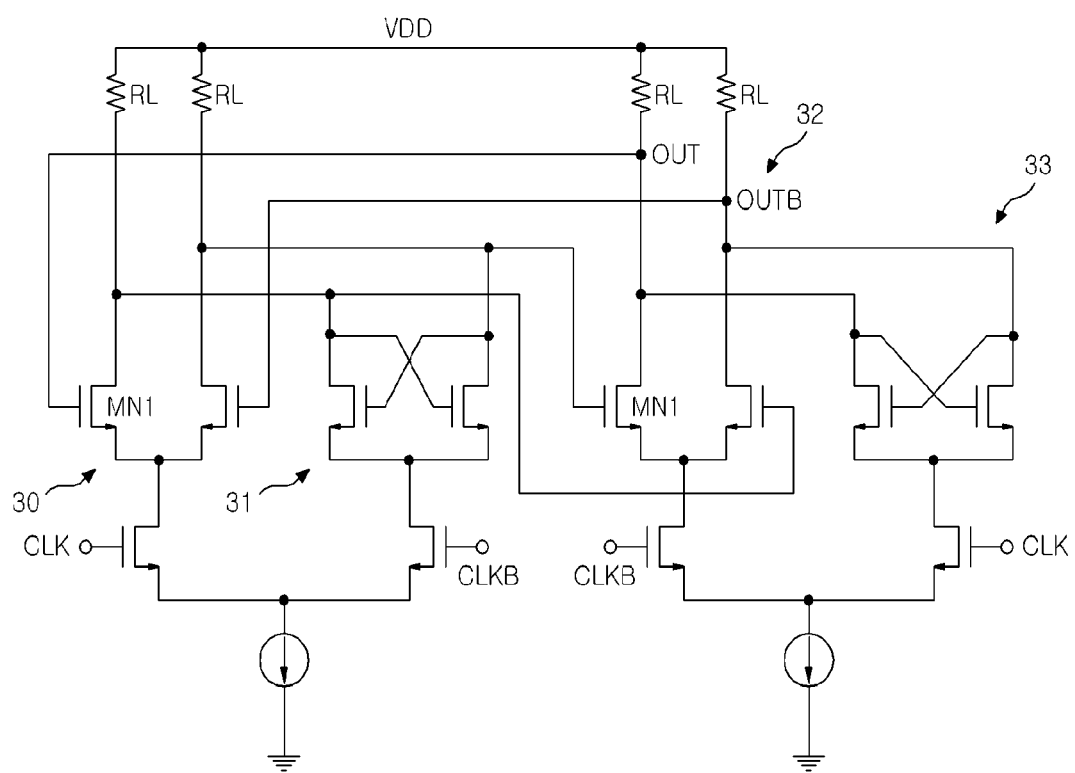
FIG. 1 is a circuit diagram of a conventional frequency divider designed in a CML configuration.
Figure 2:
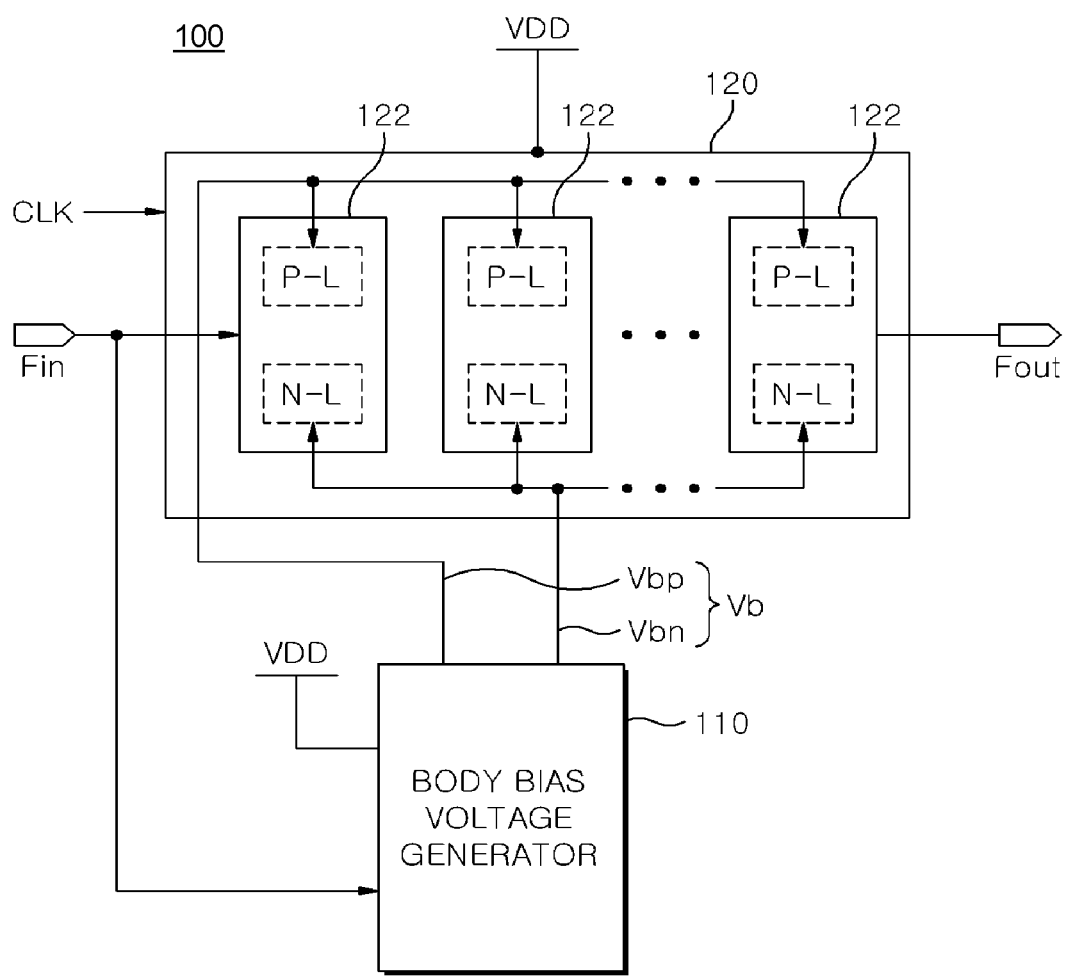
FIG. 2 is a block diagram of a frequency divider according to an exemplary embodiment.

FIG. 2 illustrates a frequency divider 100 according to an exemplary embodiment.

Referring to FIG. 2, the frequency divider 100 comprises a body bias voltage generator 110 and a divider 120.

The body bias voltage generator 110 detects a frequency of an externally-received input signal Fin, and generates a body bias voltage Vb including a PMOS body bias voltage Vbp and an NMOS body bias voltage Vbn on the basis of the detected frequency. Herein, the body bias voltage generator 110 generates the body bias voltage Vb by using a power supply voltage VDD.

The divider 120 receives the body bias voltage Vb from the body bias voltage generator 110, and controls the operation points of internal MOS transistors by using the body bias voltage Vb. Also, the divider 120 divides a frequency of the input signal Fin by N according to the controlled operations points of the MOS transistors, and outputs the N-divided frequency of the input signal Fin as an output signal Fout.

The divider 120 may include one or more TSPC D flip-flops 122 for dividing the frequency of the input signal Fin by N. Where the divider 120 includes a plurality of TSPC D flip-flops 122, the TSPC D flip-flops 122 are connected in series or in parallel to each other to divide the frequency of the input signal Fin by N.

Where the TSPC D flip-flops 122 are connected in series to each other, an input terminal of the TSPC D flip-flop 122 in the current stage may be electrically connected to an output terminal of at least one TSPC D flip-flop 122 disposed after the current stage and/or to an output terminal of at least one TSPC D flip-flop 122 disposed before the current stage.

Each of the TSPC D flip-flops 122 comprises a PMOS logic P-L having a plurality of PMOS transistors that are electrically connected to each other, and an NMOS logic N-L having a plurality of NMOS transistors that are electrically connected to each other.

The PMOS body bias voltage Vbp whose voltage level is controlled according to the frequency of the input signal Fin is applied from the body bias voltage generator 110 to the body of each of the PMOS transistors.

Also, the NMOS body bias voltage Vbn whose voltage level is controlled according to the frequency of the input signal Fin is applied from the body bias voltage generator 110 to the body of each of the NMOS transistors. Accordingly, the operation points (e.g., the threshold voltages or transconductances) of the PMOS transistors are controlled by the PMOS body bias voltage Vbp with a controlled voltage level. The operation points (e.g., the threshold voltages or transconductances) of the NMOS transistors are controlled by the NMOS body bias voltage Vbn with a controlled voltage level.

Accordingly, the operation point of the PMOS logic P-L and the operation point of the NMOS logic N-L are controlled, thereby making it possible to control the operational characteristics (e.g., the operation speed) of the TSPC D flip-flop 122 and, furthermore, to control the overall operation speed of the divider 120 including the TSPC D flip-flops 122.

Figure 3:
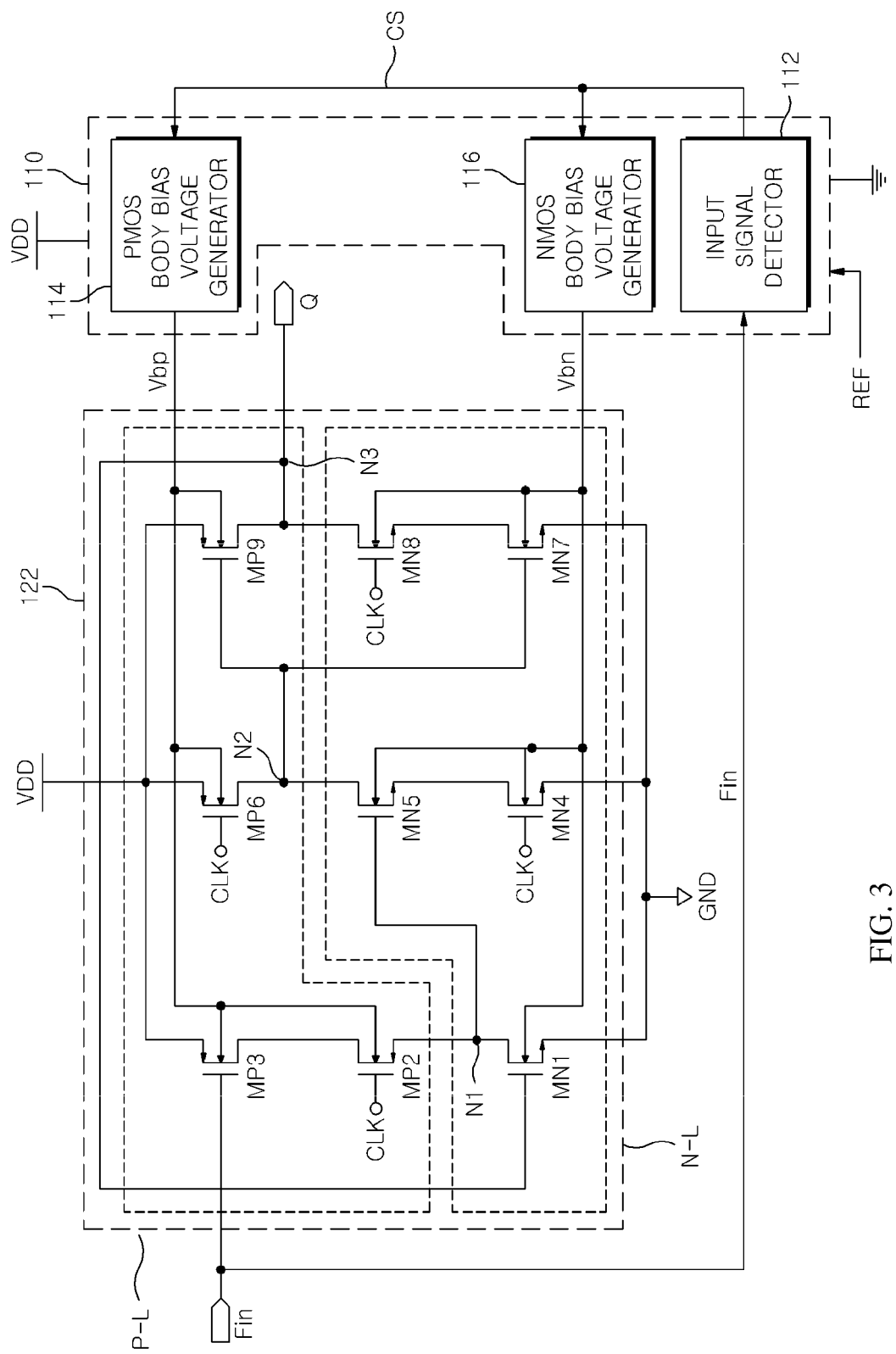
FIG. 3 is a diagram illustrating an example of an internal circuit of a TSPC D flip-flop in FIG. 2 and a connection structure between the TSPC D flip-flop and a body bias voltage generator in FIG. 2.

FIG. 3 illustrates an example of an internal circuit of the TSPC D flip-flop in FIG. 2 and a connection structure between the TSPC D flip-flop and the body bias voltage generator in FIG. 2. Herein, as an illustration, the TSPC D flip-flop 122 of FIG. 3 is assumed to be the flip-flop that first receives the input signal Fin applied to the divider 120 of FIG. 2.

Referring to FIG. 3, the body bias voltage generator 110 comprises an input signal detector 112, a PMOS body bias voltage generator 114, and an NMOS body bias voltage generator 116.

The input signal detector 112 detects an input frequency of the input signal Fin, compares the detected input frequency of the input signal Fin with a reference frequency of a reference signal REF, and outputs a comparison signal CS corresponding to the frequency difference. To this end, the input signal detector 112 may be embodied using, for example, a frequency detector or a phase detector.

The PMOS body bias voltage generator 114 receives the comparison signal CS from the input signal detector 112, and generates the PMOS body bias voltage Vbp with a controlled voltage level according to the comparison signal CS.

The NMOS body bias voltage generator 116 receives the comparison signal CS, and generates the NMOS body bias voltage Vbn with a controlled voltage level according to the comparison signal CS.

The PMOS/NMOS body bias voltage generator 114/116 may change the voltage level of the PMOS/NMOS body bias voltage Vbp/Vbn by increasing or reducing the number of charges generated according to the comparison signal output from the input signal detector 112. To this end, each of the PMOS and NMOS body bias voltage generators 114 and 116 may include a charge pump.

The generated PMOS body bias voltage Vbp and the generated NMOS body bias voltage Vbn are applied to the TSPC D flip-flop 122.

The TSPC D flip-flop 122 includes a PMOS logic P-L receiving the PMOS body bias voltage Vbp and an NMOS logic N-L receiving the NMOS body bias voltage Vbp.

The PMOS logic P-L comprises a second PMOS transistor MP2, a third PMOS transistor MP3, a sixth PMOS transistor MP6, and a ninth PMOS transistor MP9. The second PMOS transistor MP2 is connected between the third PMOS transistor MP3 and the NMOS logic N-L, and a clock signal CLK is applied to a gate of the second PMOS transistor MP2. The third PMOS transistor MP3 is connected between a power supply voltage VDD and the second PMOS transistor MP2, and the input signal Fin is applied to a gate of the third PMOS transistor MP3. The sixth PMOS transistor MP6 is connected between the power supply voltage VDD and a second node N2, and the clock signal CLK is applied to a gate of the sixth PMOS transistor MP6. Herein, the sixth PMOS transistor MP6 is connected through the second node N2 to the NMOS logic N-L. The ninth PMOS transistor MP9 is connected between the power supply voltage VDD and a third node N3, and a gate of the ninth PMOS transistor MP9 is connected to the second node N2. Herein, the ninth PMOS transistor MP9 is connected through the third node N3 to the NMOS logic N-L.

The PMOS body bias voltage Vbp, received from the PMOS body bias voltage generator 114, is applied forwardly or reversely to the body of each of the second PMOS transistor MP2, the third PMOS transistor MP3, the sixth PMOS transistor MP6, and the ninth PMOS transistor MP9. Thus, the operation points of the PMOS transistors MP2, MP3, MP6 and MP9 are controlled according to the voltage level of the PMOS body bias voltage Vbp, thereby making it possible to control the operation speeds and the power consumptions of the PMOS transistors MP2, MP3, MP6 and MP9.

The NMOS logic N-L includes a first NMOS transistor MN1, a fourth NMOS transistor MN4, a fifth NMOS transistor MN5, a seventh NMOS transistor MN7, and an eighth NMOS transistor MN8. The first NMOS transistor MN1 is connected between the first node N1 and a ground voltage GND, and the input signal Fin is applied to a gate of the first NMOS transistor MN1. Herein, the first NMOS transistor MN1 is connected through the first node N1 to the second PMOS transistor MP2 of the PMOS logic P-L. The fourth NMOS transistor MN4 is connected between the fifth NMOS transistor MN5 and the ground voltage GND, and the clock signal CLK is applied to a gate of the fourth NMOS transistor MN4. The fifth NMOS transistor MN5 is connected between the fourth NMOS transistor MN4 and the second node N2 of the PMOS logic P-L, and a gate of the fifth NMOS transistor MN5 is connected to the first node N1. The seventh NMOS transistor MN7 is connected between the eighth NMOS transistor MN8 and the ground voltage GND, and a gate of the seventh NMOS transistor MN7 is connected to the second node N2 of the PMOS logic P-L. The eighth NMOS transistor MN8 is connected between the seventh NMOS transistor MN7 and the third node N3 of the PMOS logic P-L, and the clock signal CLK is applied to a gate of the eighth NMOS transistor MN8.

The NMOS body bias voltage Vbn, received from the NMOS body bias voltage generator 116, is applied forwardly or reversely to the body of each of the first NMOS transistor MN1, the fourth NMOS transistor MN4, the fifth NMOS transistor MN5, the seventh NMOS transistor MN7, and the eighth NMOS transistor MN8. Thus, the operation points of the NMOS transistors MN1, MN4, MN5, MN7 and MN8 are controlled according to the voltage level of the NMOS body bias voltage Vbn, thereby making it possible to control the operation speeds and the power consumptions of the NMOS transistors MN1, MN4, MN5, MN7 and MN8.

An operation of the TSPC D flip-flop 122 with the above configuration will be further described below.

First, where the clock signal CLK and the input signal Fin are all low, the second PMOS transistor MP2 and the third PMOS transistor MP3 are turned on and the first NMOS transistor MN1 is turned off. Accordingly, the first node N1 connected to a drain of the second PMOS transistor MP2 becomes a high state. In this case, the fifth NMOS transistor MN5 is turned on and the sixth PMOS transistor MP6 is also turned on by the clock signal CLK. Simultaneously, the second node N2 connected to a drain of the sixth PMOS transistor MP6 is precharged to a high state.

On the other hand, where the clock signal CLK is low and the input signal Fin is high, the first node N1 becomes a low state. However, also in this case, the fifth NMOS transistor MN5 is turned off, the sixth PMOS transistor MP6 is turned on by the clock signal CLK, and second node N2 is precharged to a high state.

Accordingly, where the second node N2 is precharged, an output terminal Q latches the previous output value and thus maintains the previous output value.

Where the clock signal CLK changes from low to high, the second node N2 is maintained at a precharged high state or is discharged to a low state depending on whether the value of the first node N1 is low or high. Accordingly, the output terminal Q is determined to be low or high depending on whether the state of the second node N2 is high or low.

The TSPC D flip-flop 122 performs such an operation and outputs a single output signal Q inverted at the input signal Fin according to the input clock signal CLK. Thus, the TSPC D flip-flop 122 may be used to divide the frequency of the input signal Fin.

Although FIG. 3 illustrates that the body bias voltage generator 110 controls the voltage level of the body bias voltage Vb according to the frequency of the input signal Fin, the voltage level of the body bias voltage Vb may be controlled according to the amplitude or pulse width. For example, the input signal detector may compare the voltage level of the input signal Fin with the voltage level of a predetermined reference signal, and may control the voltage level of the body bias voltage Vb according to a comparison signal corresponding to a voltage difference between the input signal and the reference signal. This method may be embodied by using a comparator circuit including an operational amplifier.

Figure 4:
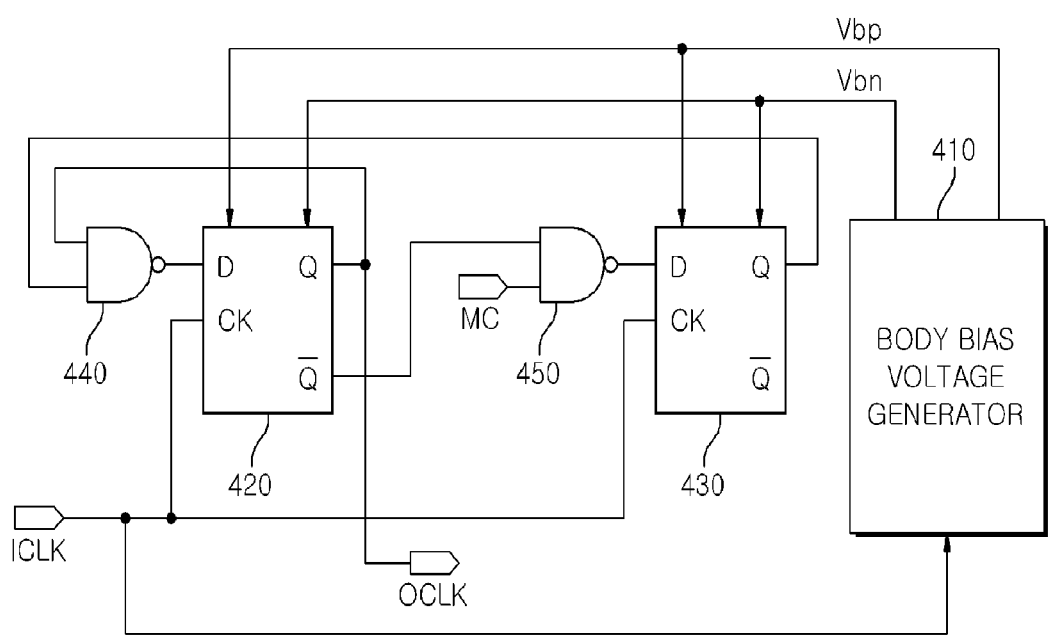
FIG. 4 is a diagram illustrating a multi-modulus prescaler capable of controlling a body bias voltage according to an exemplary embodiment.

FIG. 4 illustrates a multi-modulus prescaler 400 capable of controlling a body bias voltage according to an exemplary embodiment. Herein, as an illustration, the multi-modulus prescaler of FIG. 4 is assumed to be a prescaler whose division ratio is set to 2 and 3.

Referring to FIG. 4, the multi-modulus prescaler 400 comprises a body bias voltage generator 410, a first TSPC D flip-flop 420, a second TSPC D flip-flop 430, a first NAND gate 440, and a second NAND gate 450.

The body bias voltage generator 410 detects a frequency (phase or amplitude) of an input clock signal ICLK, and generates a PMOS body bias voltage Vbp with a controlled voltage level and an NMOS body bias voltage Vbn with a controlled voltage level according to the detected frequency of the input clock signal ICLK.

The first TSPC D flip-flop 420 comprises a PMOS logic whose operation point is controlled according to the PMOS body bias voltage Vbp and an NMOS logic whose operation point is controlled according to the NMOS body bias voltage Vbn. An output of the first NAND gate 440 is applied to an input terminal D of the first TSPC D flip-flop 420, and the input clock signal ICLK is applied to a clock terminal CK of the first TSPC D flip-flop 420. A first output terminal of the first TSPC D flip-flop 420 is connected to one of two input terminals of the first NAND gate 440, and outputs an output clock OCLK that is divided in one of division ratios 2 and 3. A second output terminal of the first TSPC D flip-flop 420 is connected to one of two input terminal of the second NAND gate 450. A division selection signal MC selecting one of division ratios 2 and 3 is applied to the other input terminal of the second NAND gate 450.

The second TSPC D flip-flop 430 comprises a PMOS logic whose operation point is controlled according to the PMOS body bias voltage Vbp and an NMOS logic whose operation point is controlled according to the NMOS body bias voltage Vbn. An output of the second NAND gate 450 is applied to an input terminal of the second TSPC D flip-flop 430, and the input clock signal ICLK is applied to a clock terminal CK of the second TSPC D flip-flop 430. An output terminal of the second TSPC D flip-flop 430 is connected to one of two input terminals of the first NAND gate 440.

Hereinafter, a description will be made of a method of driving a frequency divider according to an exemplary embodiment.

First, a body bias voltage including a PMOS body bias voltage and an MMOS body bias voltage is generated according to an input frequency of an input signal Fin applied from the outside. Herein, the body bias voltage is generated on the basis of the input signal Fin. Specifically, a frequency of an input signal is detected and the detected frequency of the input signal is compared with a reference frequency of a reference signal. Thereafter, a comparison signal corresponding to the frequency difference is generated and the body bias voltage corresponding to the generated comparison signal is generated. The generated body bias voltage is applied to the body of each of MOS transistors. Thus, an operation point of a TSPC D flip-flop constituting the MOS transistor is changed. Accordingly, the frequency divider with the TSPC D flip-flop performs a certain division operation according to the above operation point. Thus, operational characteristics of the frequency divider, for example, the power consumption and the operation speed, may be controlled by control of the body bias voltage.

Figure 5:
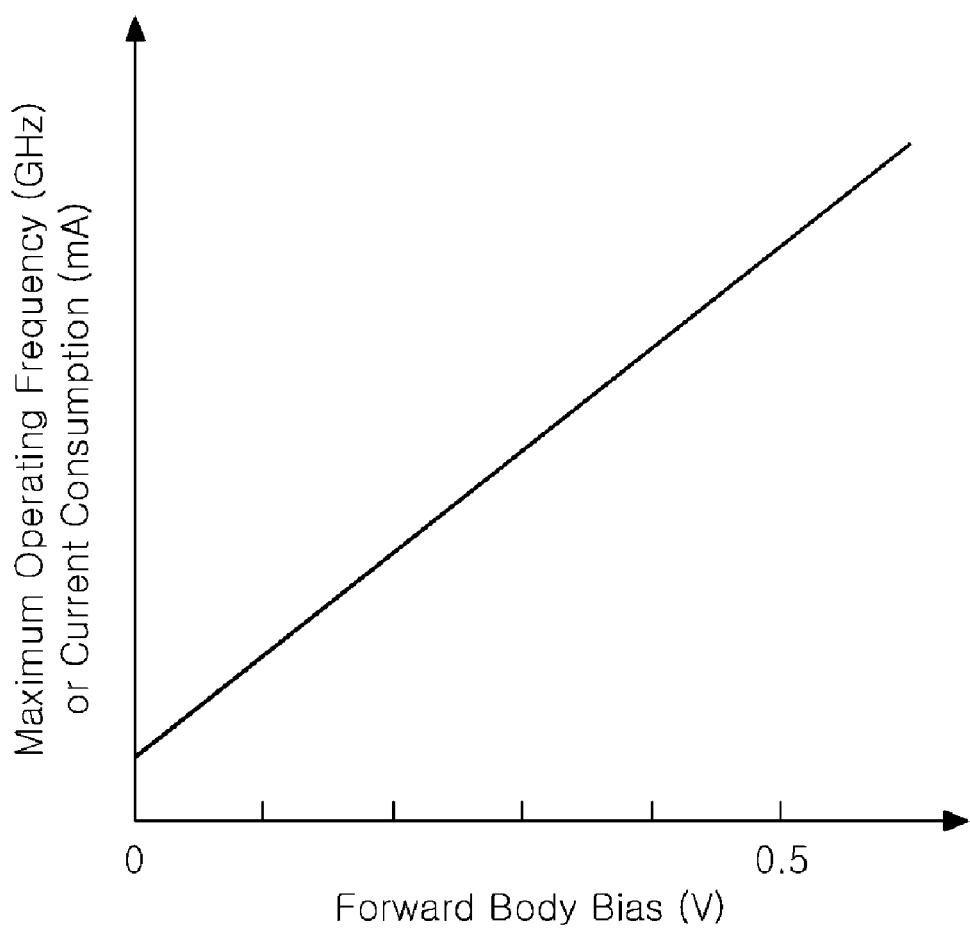
FIG. 5 is a graph illustrating operational characteristics of a frequency divider for a wireless communication system according to an exemplary embodiment

FIG. 5 is a graph illustrating operational characteristics of a frequency divider for a wireless communication system according to an exemplary embodiment. In FIG. 5, a horizontal axis represents a voltage level of a body bias voltage applied forwardly to a MOS transistor constituting the frequency divider, and a vertical axis represents the maximum operation frequency and the current consumption according to the voltage level of the body bias voltage.

As illustrated in FIG. 5, as a forward body bias current increases from 0 V to 0.5 V, the maximum operating frequency and the current consumption increases linearly. That is, where a voltage level of a forward body bias voltage increases, the maximum operating frequency and the current consumption of the frequency divider increase linearly, and where the voltage level of the forward body bias voltage decreases, the maximum operating frequency and the current consumption of the frequency divider decrease linearly. This result shows that the operation speed and the current consumption may be controlled by control of the body bias voltage.

Figure 6:
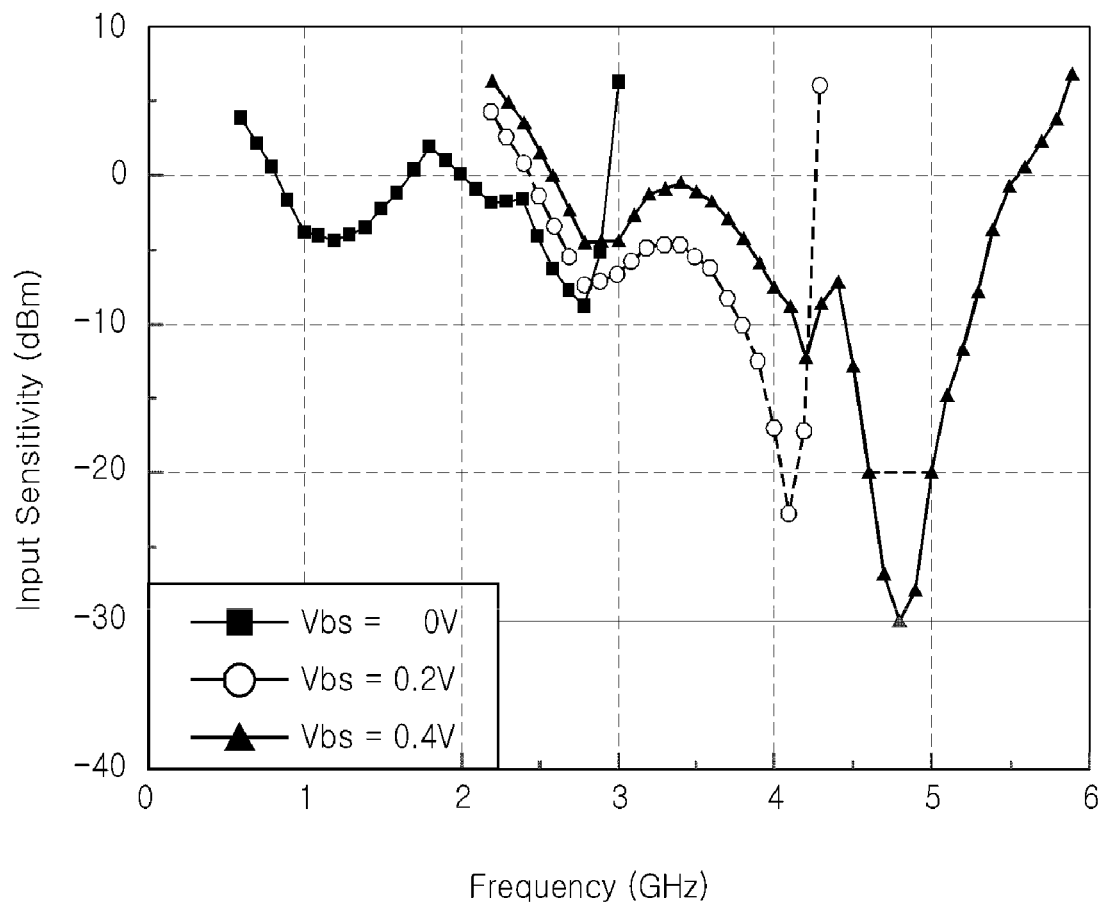
FIG. 6 is a graph illustrating measurements of operational characteristics of a frequency divider according to an exemplary embodiment.

FIG. 6 is a graph illustrating measurements of operational characteristics of a frequency divider according to an exemplary embodiment. For example, FIG. 6 illustrates the measurement results of a frequency divider that is fabricated using a 0.25-μm CMOS technology. In FIG. 6, a horizontal axis represents a frequency and a vertical axis represents input sensitivity.

FIG. 6 illustrates that the maximum operating frequency increases from 3 GHz to 6 GHz as a body bias voltage increases from 0 V to 0.4 V. That is, FIG. 6 illustrates that an operation region of a frequency divider according to an exemplary embodiment moves from a low-frequency region to a high-frequency region as a body bias voltage applied forwardly to a MOS transistor increases. Accordingly, a body bias control method according to an exemplary embodiment may effectively control the operation speed and the current consumption in a frequency divider with a TSPC D flip-flop structure.

Where the frequency of the input signal is high, the body bias voltage generator increases the forward body bias voltage. Thus, a frequency divider according to an exemplary embodiment may control the body bias voltage to be suitable for the high frequency of the input signal. Where the frequency of the input signal is low, the body bias voltage generator reduces the forward body bias voltage. Accordingly, a frequency divider according to an exemplary embodiment may control the body bias voltage to be suitable for the low frequency of the input signal. That is, a frequency divider according to an exemplary embodiment may reduce the power consumption where the frequency of the input signal is low, and increase the operation speed where the frequency of the input signal is high.

According to certain embodiments described above, a frequency divider comprises a body bias voltage generator capable of controlling a body bias voltage, and TSPC D flip-flops whose operation points are determined according to the controlled body bias voltage. Accordingly, the frequency divider may control the operation speed and the power consumption by controlling the operation points of the TSPC D flip-flops.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A frequency divider for a wireless communication system, comprising:
    a body bias voltage generator generating a body bias voltage including a PMOS body bias voltage and an NMOS body bias voltage whose voltage levels are controlled according to an input signal; and
    a divider comprising a plurality of flip-flops whose operation points are determined according to the body bias voltage, and generating an output signal by dividing a frequency of the input signal by N,
    wherein each of the flip-flops comprises:
    a PMOS logic comprising a plurality of PMOS transistors whose operation points are determined according to the PMOS body bias voltage; and
    an NMOS logic being connected electrically to the PMOS logic and comprising a plurality of NMOS transistors whose operation points are determined according to the NMOS body bias voltage.

2. The frequency divider of claim 1, wherein each of the flip-flops is a TSPC type.

3. The frequency divider of claim 1, wherein the body bias voltage generator controls the voltage level of the PMOS body bias voltage and the voltage level of the NMOS body bias voltage on the basis of the frequency or amplitude of the input signal.

4. The frequency divider of claim 3, wherein the body bias voltage generator comprises:
    an input signal detector for comparing the input frequency of the input signal with a reference frequency of a predetermined reference signal and generating a comparison signal corresponding to the frequency difference;
    a PMOS body bias voltage generator for generating the voltage level of the PMOS body bias voltage on the basis of the comparison signal; and
    an NMOS body bias voltage generator for generating the voltage level of the NMOS body bias voltage on the basis of the comparison signal.

5. The frequency divider of claim 4, wherein the input signal detector comprises a frequency detector or a phase detector.

6. The frequency divider of claim 3, wherein the body bias voltage generator comprises:
    an input signal detector for comparing the amplitude of the input signal with the amplitude of a predetermined reference signal and generating a comparison signal corresponding to the amplitude difference;
    a PMOS body bias voltage generator for generating the voltage level of the PMOS body bias voltage on the basis of the comparison signal; and
    an NMOS body bias voltage generator for generating the voltage level of the NMOS body bias voltage on the basis of the comparison signal.

7. The frequency divider of claim 6, wherein the input signal detector comprises an operational amplifier for generating the comparison signal by comparing the amplitude of the input signal with the amplitude of the predetermined reference signal.

8. The frequency divider of claim 4, wherein the PMOS body bias voltage generator and the NMOS body bias voltage generator comprise a charge pump for changing the voltage level of the PMOS body bias voltage and the voltage level of the NMOS body bias voltage by increasing or decreasing the number of charges generated on the basis of the comparison signal output from the input signal detector.

9. The frequency divider of claim 1, wherein the operation point is a threshold voltage value or a transconductance value.

10. The frequency divider of claim 1, wherein the body bias voltage generator generates the body bias voltage that is proportional to the frequency of the input signal.

11. A frequency divider for a wireless communication system, comprising:
    an input signal detector for receiving an input signal, comparing an input frequency of the input signal with a reference frequency of a predetermined reference signal, and generating a comparison signal corresponding to the frequency difference;
    a PMOS body bias voltage generator for generating a PMOS body bias voltage corresponding to the comparison signal;
    an NMOS body bias voltage generator for generating an NMOS body bias voltage corresponding to the comparison signal; and
    a divider comprising a plurality of flip-flops whose operation points are controlled according to the PMOS and NMOS body bias voltages, and generating an output signal by dividing a frequency of the input signal by N according to the controlled operation points,
    wherein each of the flip-flops comprises:
    a PMOS logic whose operation point is determined according to the PMOS body bias voltage; and
    an NMOS logic whose operation point is determined according to the NMOS body bias voltage.

12. The frequency divider of claim 11, wherein each of the PMOS and NMOS body bias voltages is proportional to the input frequency.

13. The frequency divider of claim 11, wherein each of the flip-flops is a TSPC type.

14. The frequency divider of claim 11, wherein the operation point is a threshold voltage value or a transconductance value of an MOS transistor included in each of the PMOS and NMOS logics.

15. A method of driving a frequency divider that generates an output signal by dividing an input signal by N by using a flip-flop including a plurality of PMOS transistors and a plurality of NMOS transistors, the method comprising:

generating a body bias voltage comprising a PMOS body bias voltage and an NMOS body bias voltage based on the input signal;

controlling an operation point of the flip-flop by applying the PMOS body bias voltage to each of the PMOS transistors and applying the NMOS body bias voltage to each of the NMOS transistors; and dividing the input signal by N according to the controlled operation point of the flip-flop.

16. The method of claim 15, wherein the generating of the body bias voltage comprises:

detecting an input frequency of the input signal;

comparing the detected input frequency of the input signal with a reference frequency of a predetermined reference signal and generating a comparison signal corresponding to the frequency difference; and controlling the body bias voltage according to the comparison signal.

17. The method of claim 16, wherein the voltage level of the body bias voltage is proportional to the input frequency of the input signal.

18. The method of claim 15, wherein the flip-flop is driven by a TSPC technique.

* * * * *